United States Patent [19]
Horiuchi et al.

[11] Patent Number: 5,222,739
[45] Date of Patent: Jun. 29, 1993

[54] GOLF BALL

[75] Inventors: Kuniyasu Horiuchi, Kobe; Seiichiro Endo, Nishinomiya, both of Japan

[73] Assignee: Sumitomo Rubber Industries, Ltd., Hyogo, Japan

[21] Appl. No.: 739,448

[22] Filed: Aug. 2, 1991

[30] Foreign Application Priority Data

Aug. 10, 1990 [JP] Japan .................................. 2-213119

[51] Int. Cl.$^5$ .............................................. A63B 37/12
[52] U.S. Cl. ................................. 273/235 R; 273/222; 273/230; 525/231; 525/240
[58] Field of Search .................... 273/222, 230, 235 R; 525/201, 231, 240; 526/317

[56] References Cited

U.S. PATENT DOCUMENTS 4,526,375  7/1985  Nakade ................................ 273/235
4,911,451  3/1990  Sullivan et al. .

FOREIGN PATENT DOCUMENTS 0115190  8/1984  European Pat. Off. .
0443706  8/1991  European Pat. Off. .

Primary Examiner—Jacob Ziegler
Attorney, Agent, or Firm—Birch, Stewart, Kolasch & Birch

[57] ABSTRACT

The present invention provides a golf ball having excellent impact resilience and good flying performance, which comprises a core and a cover covering the core, wherein the cover contains at least 20 % by weight of a carboxyl-rich ionomer resin prepared by neutralizing 15 to 80 mol % of carboxylic acid groups of an olefinic copolymer containing 16 to 30 % by weight of an alpha, beta-ethylenic unsaturated carboxylic acid with monovalent or divalent metal ions.

8 Claims, No Drawings great_circle

GOLF BALL

FIELD OF THE INVENTION

The present invention relates to a golf ball. More particularly, it relates to a golf ball having excellent impact resilience and flying performance, of which the cover is formed from an ionomer resin which contains an alpha, beta-ethylenic unsaturated carboxylic acid in a larger amount than conventional ionomer resins.

BACKGROUND OF THE INVENTION

A golf ball is composed of a core and a cover covering the core. The cover generally used is mainly formed from an ionomer resin (see Japanese Kokai Publications 135078/1984 and 82768/1986), because the ionomer resin is commercially available cheaper than the other cover resins and has excellent cut resistance.

The ionomer resin is a resin which is prepared by neutralizing a copolymer of an alpha-olefin, an alpha, beta-ethylenic unsaturated carboxylic acid and optionally an alpha, beta-ethylenic unsaturated carboxylic ester with metal, and many types of them are commercially available. The ionomer resins which are used as the cover of the golf balls, however, contain the alpha, beta-ethylenic unsaturated carboxylic acid in an amount of less than 15 % by weight before neutralizing, and the other carboxyl-rich ionomer resins which contain more than 15 % by weight of it have never been employed.

SUMMARY OF THE INVENTION

It has been surprisingly found that a carboxyl-rich ionomer resin which contains 16 to 30 % by weight of an alpha, beta-ethylenic unsaturated carboxylic acid significantly improves the properties of the golf balls, such as impact resilience and flying performance. Thus, the present invention provides a golf ball which comprises a core and a cover covering the core, wherein the cover contains at least 20 % by weight of a carboxyl-rich ionomer resin prepared by neutralizing 15 to 80 mol % of carboxylic acid groups of an olefinic copolymer containing 16 to 30 % by weight of an alpha, beta-ethylenic unsaturated carboxylic acid with monovalent or divalent metal ions.

DETAILED DESCRIPTION OF THE INVENTION

The olefinic copolymer of the carboxyl-rich ionomer resin is obtained by copolymerizing an alpha-olefin with an alpha, beta-ethylenic unsaturated carboxylic acid. In the present invention, an amount of the alpha, beta-ethylenic unsaturated carboxylic acid is limited to 16 to 30 % by weight, preferably 20 to 30 % by weight, based on the total monomer weight. Thus, the balance of the monomer is the alpha-olefin. If the amount of the alpha, beta-ethylenic unsaturated carboxylic acid is less than 16 % by weight, a stiffness modulus is low and an impact resilience is low, thus resulting in poor flying performance. A cut resistance is also deteriorated. If it is more than 30 % by weight, the stiffness modulus of the ball is so high that a hit feeling is poor, and the durability when hit repeatedly is low. A portion of the alpha-olefin may be replaced with an alpha, beta-ethylenic unsaturated carboxylic ester which, however, does not exceed 20 % by weight based on the total monomer weight. Typical examples of the alpha, beta-ethylenic unsaturated carboxylic acids are acrylic acid, methacrylic acid, maleic acid, fumaric acid and the like. Typical examples of the alpha-olefins are ethylene, propylene and the like.

The carboxyl-rich ionomer resin of the present invention is prepared by neutralizing 15 to 80 mol % of the carboxylic acid groups of the above mentioned olefinic copolymer with monovalent or divalent metal ions. Typical examples of the metal ions are monovalent metal ions, such as lithium ions, sodium ions, potassium ions and the like; divalent metal ions, such as alkaline earth metal ions (e.g. magnesium ions and calcium ions) and other metal ions (e.g. zinc ions and copper ions). If the neutralizing degree is less than 15 mol %, the impact resilience and durability of the ball are poor. If it is more than 80 mol %, the molding ability is poor and it is difficult to cover it on the core.

It is preferred that the carboxyl-rich ionomer resin of the present invention has a stiffness modulus of 3,000 to 6,000 Kgf/cm$^2$. Values of less than 3,000 Kg/cm$^2$ reduce impact resilience and those of more than 6,000 Kgf/cm$^2$ deteriorate hit feeling and durability when hit repeatedly.

The cover of the present invention contain at least 20 % by weight, preferably at least 30 % by weight, of the above obtained carboxyl-rich ionomer resin. If the carboxyl-rich ionomer resin is less than 20 % by weight, the technical effects of the improvement of rebound resilience and flying ability are insufficient. The cover resin composition may comprises the carboxyl-rich ionomer and a small amount of additives (e.g. pigment, filler, dispersant, antioxidant, ultraviolet absorber, photostabilizer and the like). The cover may further contain other resins, such as polyolefin, polyester elastomer, polyamide and the like, but these resins are formulated in a small amount, especially 10 by weight or less.

The core of the golf ball of the present invention can be either a solid core or a thread-wound core. The solid core is generally prepared by vulcanizing a rubber composition, for example at 140 to 170 ° C for 10 to 49 minutes under pressure. The rubber composition may be 100 parts by weight of polybutadiene rubber, 10 to 60 parts by weight of a co-crosslinking agent (e.g. an alpha, beta-ethylenic unsaturated carboxylic acid, such as acrylic acid and methacrylic acid, a metal salt thereof, and a monohydric monomer, such as trimethylolpropane trimethacrylate), 10 to 30 parts by weight of a filler (e.g. zinc oxide and barium sulfate), 0.5 to 5.0 parts by weight of a peroxide (e.g. dicumyl peroxide) and 0.1 to 1.0 parts by weight of an antioxidant. The solid core may have a multilayer construction if necessary.

The thread-wound core is generally composed of a center and a thread rubber layer wound on the center. The center may be either a liquid center or a solid center. the solid center can be prepared by vulcanizing the rubber composition as explained for the solid core. Thread rubber is known to the art and may be prepared by vulcanizing a rubber composition comprising a natural rubber or a combination of a natural rubber and a synthetic polyisoprene rubber, an antioxidant, a vulcanization promoter and sulfur.

The above described solid core and thread-wound core scope of the present invention is mere exemplification and are not limited thereto.

A method for covering the cover resin composition on the core is not limited and can be conducted by art-known methods. For example, a cover resin composition is formed into hemispherical half shells and a core is surrounded with two half shells, followed by pressure-molding at 130 to 170° C. for 1 to 5 minutes. Also, the cover composition may be injection-molded to cover the core. A thickness of the cover layer is generally 1.0 to 3.0 mm. Dimples are formed on the surface of the cover and if necessary stamps and paint layers are formed thereon.

EXAMPLES

The present invention is illustrated by the following Examples which, however, are not to be construed as limiting the invention to their details.

EXAMPLES 1-4 AND COMPARATIVE EXAMPLES 1-3

A rubber composition was prepared by mixing 100 parts by weight of cis-1,4-polybutadiene (available from Japan Synthetic Rubber Co., Ltd. as JSR BR01 ®), 30 parts by weight of zinc acrylate (available from Nippon Shokubai Kagaku Kogyo Co., Ltd.), 20 parts by weight of zinc oxide (available from Toho Zinc Co., Ltd.) and one part by weight of dicumyl peroxide (available from Nippon Oil & Fats Co., Ltd.), and compression-molded at 150° C. for 30 minutes to form a solid core having a diameter of 38.5 mm.

Separately, the ionomer resin having a composition as shown in Table 1 was mixed, and 100 parts by weight of the ionomer resin mixture was mixed with 2 parts by weight of titanium dioxide by an extruder to obtain a cover resin composition. In Table 1, the numbers for the ionomer resins are based on parts by weight and the total of them indicates 100. Thus, the numbers also show % by weight.

The solid core was covered with the cover resin composition by an injection molding to obtain a two piece solid golf ball. The ball was then coated with a paint to obtain a golf ball having a diameter of 42.8 mm.

The obtained golf balls were evaluated by ball weight, compression, initial velocity, durability, low temperature durability, flying distance (carry) and stiffness modulus and the results ar shown in Table 1.

As is shown in Table 1, the gold balls of Examples 1 to 4 have superior initial velocities (i.e. higher impact resilience) and superior flying distance to those of Comparative Examples 1 to 3. The golf balls of Examples are excellent in durability and low temperature durability and have good hit feeling.

What is claimed is:

1. A gold ball comprising a core and a cover covering said core, wherein said cover contains at least 20% by weight of a carboxyl-rich ionomer resin having a stiffness modulus of 3,000 to 6,000 Kgf/cm$^2$, prepared by neutralizing 15 to 80 mol% of carboxylic acid groups of an olefinic copolymer containing 20 to 30% by weight of an $\alpha$-$\beta$-ethylenic unsaturated carboxylic acid with monovalent or divalent metal ions.

2. The golf ball according to claim 1 wherein said olefinic copolymer is obtained by copolymerizing an alpha-olefin with an alpha, beta-ethylenic unsaturated carboxylic acid; an amount of the alpha, beta-ethylenic unsaturated carboxylic acid being 25 to 30% by weight based on the total monomer weight.

3. The golf ball according to claim 1 wherein said alpha, beta-ethylenic unsaturated carboxylic acid includes acrylic acid, methacrylic acid, maleic acid or fumaric acid.

4. The golf ball according to claim 1 wherein said alpha-olefin includes ethylene or propylene.

5. The golf ball according to claim 1 wherein said metal ions include lithium ions, sodium ions, potassium ions, magnesium ions, calcium ions, zinc ions or copper ions.

6. The golf ball according to claim 1 wherein said cover comprises the carboxyl-rich ionomer resin and an additive.

7. The golf ball according to claim 1, wherein said cover further comprises an ionomer resin having an olefinic copolymer having an $\alpha$-$\beta$-ethylenic unsaturated carboxylic acid in an amount less than 15% by weight of said olefinic copolymer, and an additive.

8. The golf ball according to claim 1 wherein said core is a solid core or a thread-wound core.

TABLE 1

| | Ionomer resin | | | | | | | | | | |
|---|---|---|---|---|---|---|---|---|---|---|---|
| | | | Stiffness | Examples | | | | | Comparative Examples | | |
| Metal ion for neutralization | Acid content (% by weight)$^a$ | Neutralization degree (mol/%)$^b$ | modulus (Kgf/cm$^2$) | 1 | 2 | 3 | 4 | 5 | 1 | 2 | 3 |
| Sodium | 20 | 55 | 4,500 | 50 | — | — | — | 50 | — | — | — |
| Zinc | 25 | 45 | 3,300 | — | 100 | — | — | 50 | — | — | — |
| Lithium | 20 | 60 | 4,700 | — | — | 30 | — | — | — | — | — |
| Magnesium | 20 | 40 | 4,000 | — | — | — | 40 | — | — | — | — |
| Sodium | 15 | 30 | 2,900 | — | — | — | 30 | — | 50 | 100 | — |
| Zinc | 15 | 60 | 2,600 | 50 | — | 70 | 30 | — | 50 | — | 100 |
| Ball weight (g) | | | | 45.1 | 45.0 | 45.1 | 45.1 | 45.1 | 45.1 | 45.0 | 45.1 |
| Ball compression (PGA) | | | | 100 | 99 | 99 | 98 | 105 | 96 | 95 | 94 |
| Ball initial velocity$^1$ (m/sec.) | | | | 65.5 | 65.3 | 65.4 | 65.3 | 65.7 | 65.0 | 64.7 | 64.9 |
| Durability (index)$^2$ | | | | 100 | 100 | 100 | 102 | 100 | 100 | 98 | 98 |
| Low temperature durability$^3$ | | | | No breaks | No breaks | No breaks | No breaks | No breaks | All breaks | All breaks | No breaks |
| Flying distance$^4$ (carry) (yards) | | | | 223.2 | 222.4 | 222.9 | 222.0 | 224.0 | 215.0 | 211.0 | 213.0 |
| Stiffness modulus of cover (Kg/cm$^2$)$^5$ | | | | 4,000 | 3,300 | 3,900 | 3,500 | 4,500 | 2,800 | 2,900 | 2,600 |

$^1$Ball initial velocity: A golf ball was hit by a No. 1 wood at a head speed of 45 m/s using a swing robot (available from True Temper Co., Ltd.) and its initial velocity was determined. Determination was carried out with 10 balls and the result is shown in an average value.
$^2$Durability: a golf ball was struck to a metal board at a speed of 45 m/s and number of striking was determined until the ball was broken. The number is expressed as an index number when the number of Example 1 is made 100.
$^3$Low-temperature durability: Ten golf balls were stored at −30° C. and then struck to a metal board at 45 m/s by an air gun up to 50 times. Number of the broken balls are shown in Tables.
$^4$Flying distance (carry): A golf ball was hit by a No. 1 wood at a head speed of 45 m/s using a swing robot (available from True Temper Co., Ltd.) and its flying distance (carry) was determined. Determination was carried out with 10 balls and the result is shown in an average value.
$^5$Stiffness modulus of cover: This was determined by a stiffness tester (available from Toyo Seiki Co., Ltd.). A sample for the determination was prepared by press-molding to form a plain plate and allowing to stand at 23° C. at a relative humidity of 50% for 2 weeks.
$^a$Amount of the remaining acid groups and Neutralization degree: The cover resin was dissolved in hot tetrahydrofuran, which was titrated with potassium hydroxide with heating to determine the remaining carboxyl group (COOH). The metal content (COOM), i.e. alkali metal and divalent metal, was determined by atomic analysis. An amount of the carboxyl groups before neutralization was obtained.
$^b$Neutralization degree: The obtained values from the above (a) were employed and the neutralization degree was calculated from the equation;

$$\text{Neutralization degree (\%)} = \frac{[COOM]}{[COOH] + [COOM]} \times 100$$

* * * * *